United States Patent [19]

Matsuoka

[11] Patent Number: 4,908,680

[45] Date of Patent: Mar. 13, 1990

[54] SEMICONDUCTOR INTEGRATED CIRCUIT

[75] Inventor: Hiroshi Matsuoka, Itami, Japan

[73] Assignee: Mitsubishi Denki Kabushiki Kaisha, Japan

[21] Appl. No.: 224,294

[22] Filed: Jul. 26, 1988

[30] Foreign Application Priority Data

Jul. 28, 1987 [JP] Japan ................... 62-189379

[51] Int. Cl.$^4$ ............ H01L 29/80; H01L 23/48; H01L 29/06
[52] U.S. Cl. ......................... 357/22; 357/68; 357/55
[58] Field of Search ............... 357/22 H, 22 G

[56] References Cited

U.S. PATENT DOCUMENTS 3,969,745 7/1976 Blocker, III .................. 357/22
4,313,126 1/1982 Krumm et al. ................ 357/22 H

OTHER PUBLICATIONS

Pauley et al., "A2 to 40 GHz Monolithic Distributed Amplifier", 1985 IEEE, pp. 15–17.
Emori et al., "A2 to 20 GHz Monolithic Distributed Amplifier", pp. 29–34.

Primary Examiner—Rolf Hille
Assistant Examiner—Robert P. Limanek
Attorney, Agent, or Firm—Leydig, Voit & Mayer

[57] ABSTRACT

A semiconductor integrated circuit device includes a plurality of transistors each comprising a source region, a drain region, and a gate region, the source regions of the transistors are commonly connected to each other via via-holes produced through the semiconductor substrate at positions corresponding to the source regions, the gate regions of the transistors are commonly connected to each other on the semiconductor substrate, and the via-holes of the semiconductor substrate are arranged dispersively in two-dimensional direction in the surface of the semiconductor substrate.

3 Claims, 4 Drawing Sheets

SEMICONDUCTOR INTEGRATED CIRCUIT

FIELD OF THE INVENTION

The present invention relates to a semiconductor integrated circuit device and, more particularly, to an improvement in a pattern layout of a broad-band amplifier.

BACKGROUND OF THE INVENTION

FIG. 3 shows a prior art example of a semiconductor integrated circuit device, and FIG. 4 shows a cross-section taken along line A to A of FIG. 3. Reference numeral 1 designates a GaAs semiconductor substrate (hereinafter referred to as "substrate"). Source wirings or electrodes 2a to 2e are disposed on the substrate 1 separated from each other at equal intervals to contact the source regions of the transistors formed in substrate 1. Via-holes 3a to 3e penetrate through the substrate 1 at positions corresponding to the central portions of the source wirings 2a to 2e. The source wirings 2a to 2e are electrically connected to a grounded region 31 which is disposed at the rear surface of the substrate 1. Thus, the source wirings 2a to 2e are commonly grounded. A drain wiring or electrode 4a for contacting a drain region of the transistors is disposed at approximately centrally between the source wirings 2a and 2b on the substrate 1. Similarly, drain wiring 4b is disposed between the source wirings 2b and 2c, a drain wiring 4c is disposed between the source wirings 2c and 2d, a drain wiring 4d is disposed between the source wirings 2d and 2e. These drain wirings 4a to 4d are commonly connected after their paths extend a predetermined length in the downward direction in FIG. 3. The drain wirings 4a to 4d extend for a predetermined length because certain electrical characteristics, such as the frequency characteristics of the device, are determined by this length in a broad-band amplifier. Furthermore, a gate wiring 51 for contacting a gate region is disposed on a region of the substrate 1 which is between the source wiring 2a and the drain wiring 4a. A transistor Q1 includes the source wiring 2a, drain wiring 4a, and gate wiring 51. Similarly as above, a gate wiring 52 is provided on a region of the substrate 1 which is between by the source wiring 2b and the drain wiring 4a, and a transistor Q2 includes the source wiring 2b, drain wiring 4a, and gate wiring 52. Also, a transistor Q3 includes the source wiring 2c, drain wiring 4b, and gate wiring 53. A transistor Q4 includes the source wiring 2e, drain wiring 4b, and gate wiring 54. A transistor Q5 includes the source wiring 2c, drain wiring 4c, and gate wiring 55. A transistor Q6 includes the source wiring 2d, drain wiring 4c, and gate wiring 56. A transistor Q7 includes the source wiring 2d, drain wiring 4d and gate wiring 47. A transistor Q8 includes the source wiring 2e, drain wiring 4d, and gate wiring 58. Thus, a broad-band amplifier section 6 includes these source wirings 2a to 2d, via-holes 3a to 3e, drain wirings 4a to 4d, gate wirings 51 to 58, and transistors Q1 to Q8.

Besides, in producing via-holes 3a to 3e, the spacing between adjacent via-holes should be maintained in excess of a predetermined value. This spacing is necessary because it is technically difficult to produce the penetrating holes as via-holes 3a to 3e in substrate 1 close lower than a predetermined value because the penetrating holes are produced by etching, and because mutual interferences between via-holes 3a to 3e must be considered.

Generally, in producing a broad-band amplifier on a semiconductor chip, the configuration of the semiconductor chip is determined by the layout of the broad-band amplifier section 6, that is, by the configuration of the broad-band amplifier section 6.

Accordingly, in the prior art semiconductor integrated circuit device in which the via-holes 3a to 3e are laid out on a straight line on the semiconductor substrate 1, the broad-band amplifier section 6 becomes relatively long and narrow. As a result, the semiconductor chip becomes also relatively long and narrow, thereby reducing the number of the semiconductor chips which can be produced from a wafer (hereinafter referred to as "theoretical chip number") when compared with a case where a square chip of the same area is employed. Furthermore, there may be unused space on the substrate 1 because the lengths of the drain wirings 4a to 4d should be established at values larger than a predetermined value based on the electrical characteristics of the device, which unfavourably results in an increase in the area of the broad-band amplifier section 6, and in turn, an increase in the chip area and reduction in the theoretical chip number.

SUMMARY OF THE INVENTION

An object of the present invention is to provide a semiconductor integrated circuit device capable of increasing the theoretrical chip number.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, there are provided a plurality of transistors comprising a source region wherein a drain region, and a gate region, the source regions of the transistors are commonly connected to each other through via-holes provided penetrating through the substrate at positions corresponding to the source region, the gate regions of the transistors are commonly connected to each other on the semiconductor substrate, the drain regions of the transistors are commonly connected to each other on the semiconductor substrate, and the via-holes of the transistors are arranged dispersively in the two-dimensional directions on the surface of the semiconductor substrate. Accordingly, the configuration of the broad-band amplifier, and, in turn, the configuration of the semiconductor chip is much closer to a square. Thereby the area of the broad-band amplifier section, and in turn, the area of the semiconductor chip is reduced, thereby increasing the theoretical chip number.

DETAILED DESCRIPTION OF THE PREFERRED EMBODIMENTS

An embodiment of the present invention will be described in detail with reference to the drawings.

Figure 1:
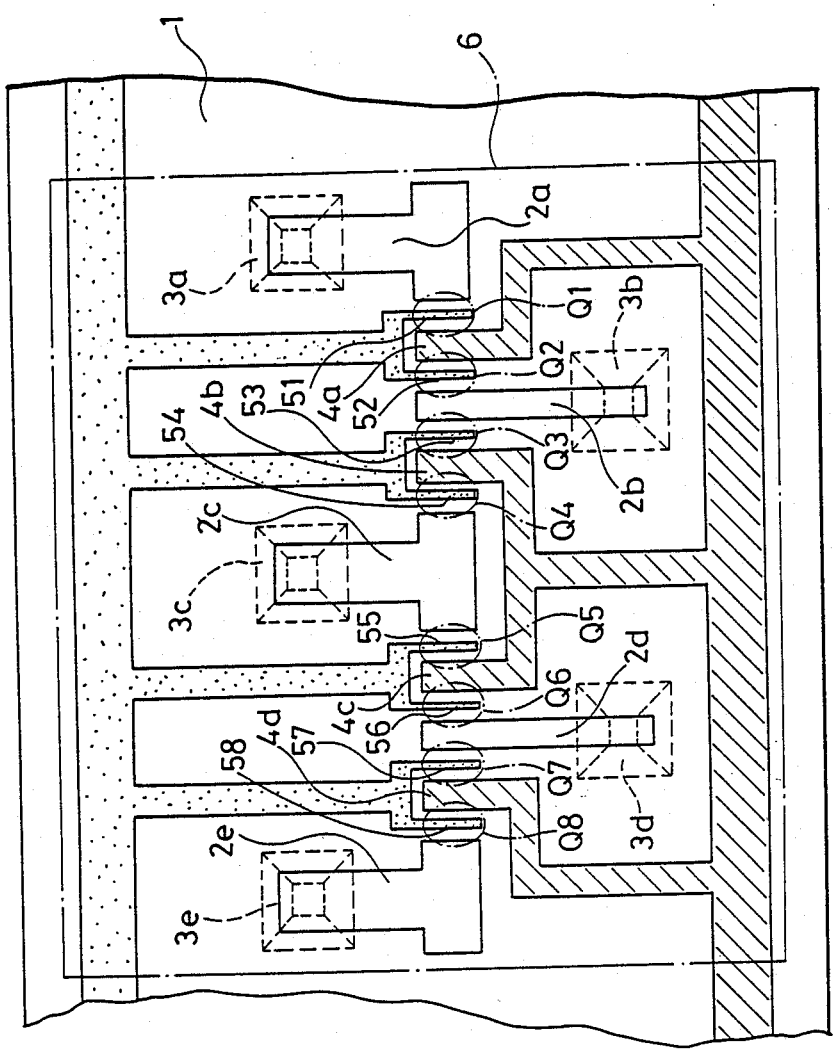
FIG. 1 is a plan view showing a semiconductor integrated circuit device as an embodiment of the present invention.

FIG. 1 shows a semiconductor integrated circuit device as an embodiment of the present invention. Differences in construction of the embodiment from that of the prior art device of FIG. 1 reside in the arrangement of the via-holes 3a to 3e in a two-step configuration, i.e., along both of two generally parallel lines, on the surface of the substrate 1 and in the reduction in the lengths of the source wirings 2a to 2e in the direction of transistors Q1 to Q8.

The production method of the embodiment will be described.

(1) First of all the, respective FET elements are produced on a GaAs substrate.

(2) The respective FET elements are connected with each other by wiring metals of desired widths and thicknesses so as to constitute an amplifier. The widths and the thicknesses of the wiring metals are determined from the characteristics and performances of the elements.

(3) After the pattern is produced on a surface substrate, the opposite surface of the GaAs substrate is ground to make the substrate thinner.

(4) Via-holes are produced penetrating the thinned wafer from the side of the ground surface toward the front surface.

(5) Metal is plated at the penetrating via-holes and it is connected with the pattern at the surface.

In the embodiment of the present invention, because the via-holes 3a to 3e are arranged in a two-step configuration and the lengths of the source region wiring in the direction of the transistors is reduced, the length of the broad-band amplifier section 6 in the direction of the transistors Q1 to Q8 can be reduced. In other words, a broad-band amplifier section 6 having a shape much closer to a square and having much less area than the prior art semiconductor chip is obtained and the theoretical chip number is also increased by about 30 %. Furthermore, since the theoretical chip number is increased, the production efficiency is enhanced and cost reduction is achieved.

Figure 2:
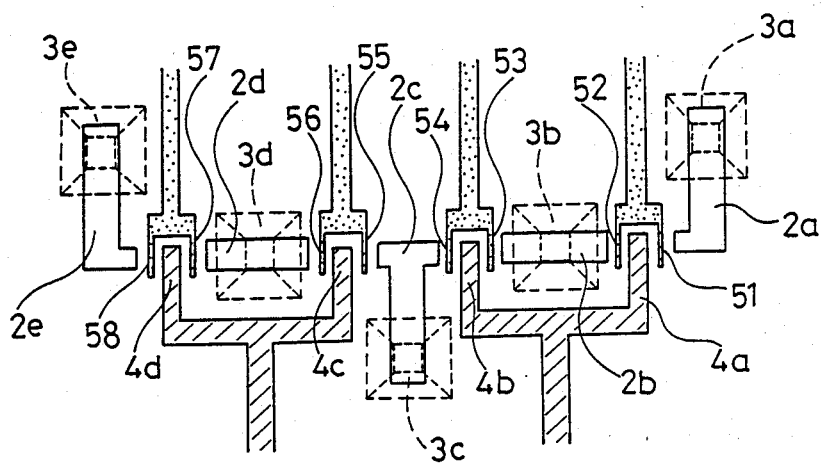
FIG. 2 is a plan view showing a semiconductor integrated circuit device as another embodiment of the present invention.
Figure 3:
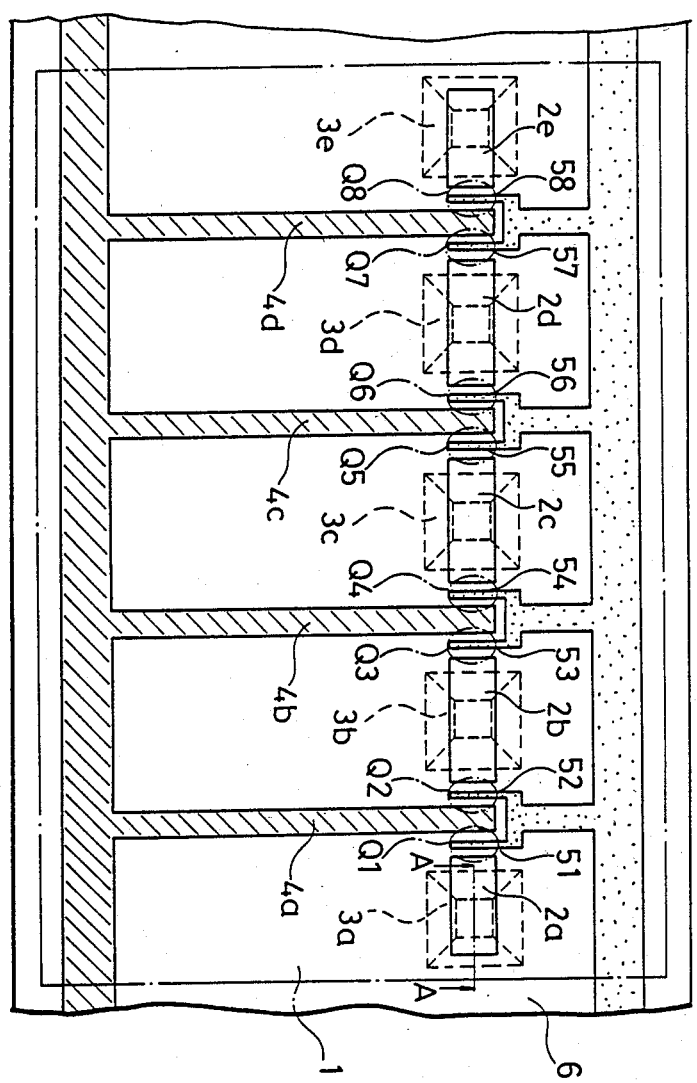
FIG. 3 is a plan view showing a prior art semiconductor integrated circuit device.
Figure 4:
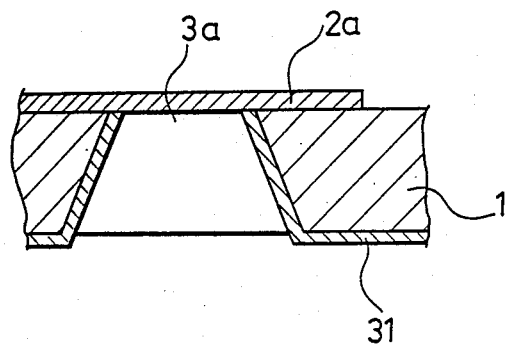
FIG. 4 is a cross-sectional view showing the device of FIG. 3 along line A to A of FIG. 3.

In the above-illustrated embodiment, the via-holes are arranged in a two-step configuration, but the via-holes may be arranged for example in a three-step configuration i.e., along each of three generally parallel lines. This arrangement provides a means of dispersively i.e. arranging the transistors in two-dimensions on the surface of the substrate. FIG. 2 shows an embodiment in which the via-holes are provided in a three-step configuration.

As is evident from the foregoing description, according to the present invention, the via-holes of the transistors are arranged dispersively in two-dimensions on the surface of the semiconductor substrate. Thus, the semiconductor chip is produced in a shape much closer to a square having less area, thereby increasing the theoretical chip number and reducing the production cost.

What is claimed is:

1. A semiconductor integrated circuit device comprising:
   a semiconductor substrate containing via-holes;
   a plurality of transistors, each including a source region and a drain region disposed on said semiconductor substrate and a gate region disposed between said source region and said drain region wherein the via-holes are disposed in said substrate at said source regions, said source regions of said transistors are commonly connected to each other through the via-holes , said gate and drain regions of said transistors are respectively commonly connected to each other on said semiconductor substrate, the via-holes in said semiconductor substrate are arranged in two dimensions in said semiconductor substrate, each of the via-holes lies along one of first and second generally parallel straight lines, and each pair of via-holes, consisting of one via-hole lying along the first line and one via-hole lying along the second line, lies on a straight line that is oblique to the first and second lines.

2. The semiconductor integrated circuit device as defined in claim 1 including via-holes lying along a third straight line generally parallel to the first and second lines.

3. The semiconductor integrated circuit device as defined in claim 2 wherein a via-hole lying along the third line intersects a straight line that is oblique to the first, second, and third lines and intersects a via-hole lying along the first line and a via-hole lying along the second line.

* * * * *